United States Patent [19]
Nishida et al.

[11] Patent Number: 5,970,401
[45] Date of Patent: Oct. 19, 1999

[54] BALANCED-TYPE MIXER HAVING CIRCUIT BOARD

[75] Inventors: Hiroshi Nishida, Kawanishi; Toru Tanizaki, Kyoto; Koichi Sakamoto, Ohtsu, all of Japan

[73] Assignee: Murata Manufacturing Co., Ltd., Japan

[21] Appl. No.: 08/924,019

[22] Filed: Aug. 29, 1997

[30] Foreign Application Priority Data

Aug. 29, 1996 [JP] Japan ..................................... 8-228378

[51] Int. Cl.⁶ ....................................................... H04Q 7/20
[52] U.S. Cl. ........................... 455/326; 455/327; 455/323
[58] Field of Search .................................... 455/326, 327, 455/328, 330, 307, 323

[56] References Cited

U.S. PATENT DOCUMENTS

| | | | |
|---|---|---|---|
| 4,541,124 | 9/1985 | Lacour et al. | 455/330 |
| 4,542,535 | 9/1985 | Bates et al. | 455/327 |
| 4,627,104 | 12/1986 | Knochel | 455/330 |
| 5,392,051 | 2/1995 | Uematsu et al. | 342/165 |
| 5,640,700 | 6/1997 | Shingyoji et al. | 455/328 |
| 5,770,989 | 7/1996 | Ishikawa et al. | 333/248 |

Primary Examiner—Edward F. Urban
Assistant Examiner—Tilahun Gesesse
Attorney, Agent, or Firm—Ostrolenk, Faber, Gerb & Soffen, LLP

[57] ABSTRACT

A balanced-type mixer having easier mounting of a circuit board into a dielectric line apparatus, easier matching between a dielectric line and diodes, and reduced conversion loss. A first conductor pattern is disposed in a direction substantially perpendicular to first dielectric strips which constitute a first NRD guide, first and second filter circuits are provided at positions on opposite sides of the first dielectric strips, thus forming a first resonance circuit, and beam lead diodes are mounted in series within the resonance circuit. Further, a second conductor pattern is extended substantially from the midpoint between the filter circuits, and a third filter circuit is provided, thus forming a second resonance circuit. A second NRD guide based on second dielectric strips is connected to the second resonance circuit.

11 Claims, 9 Drawing Sheets

BALANCED-TYPE MIXER HAVING CIRCUIT BOARD

BACKGROUND OF THE INVENTION

1. Field of the Invention

The present invention relates to a balanced-type mixer for use in a transmitter-receiver at millimeter-wave and microwave frequencies.

2. Description of the Related Art

A diode mount structure in a nonradiative dielectric line (hereinafter referred to as an "NRD guide") and a mixer using such structure are disclosed in "Nonradiative Dielectric Line Circuit Elements using Beam Lead Diodes", Journal of The Institute of Electronics, Information and Communication Engineers, by Kuroki and Yoneyama, C-I, Vol. J73-C-I, No.2, pp.71–76, February 1989.

This mixer is structured in such a way that a coupler is formed based on an NRD guide, and a circuit board having diodes mounted thereon is perpendicularly interposed between dielectric strips in order to couple the diodes to the NRD guide.

However, in the structure shown in the above reference, since a circuit board having diodes mounted thereon is disposed perpendicular to the direction along the length of a dielectric strip, it is difficult to fix the circuit board within the apparatus and the circuit board is likely to incline; therefore, ease of mounting is poor. Further, since a thin plate having a high dielectric constant must be inserted into an NRD guide or a gap must be provided to achieve matching, design and manufacturing are not easy.

Further, the coupler of the NRD guide has problems in that, as shown in FIG. 12, the frequency at which the power distribution ratio becomes equal is at one point. The farther away from that frequency, the more the balance of the power distribution ratio is distorted, and the advantages of the balanced-type mixer, such as suppression of image signals and cancellation of the effect of the drift of local signals, are decreased. In addition, in a conventional balanced-type mixer, since a coupler based on an NRD guide is formed, the line length of the NRD guide is increased, and losses in the coupler portion become a problem.

SUMMARY OF THE INVENTION

The present invention relates to a design for a balanced-type mixer which is capable of increasing the ease of mounting of a circuit board in a dielectric line apparatus, easily achieving matching between a dielectric line and diodes, reducing conversion losses, and further, achieving balance over a wide frequency band.

The balanced-type mixer according to a first aspect of the present invention comprises a dielectric line apparatus in which a circuit board, together with first and second dielectric strips, is disposed between two nearly parallel conductor planes. The conductor planes and the first and second dielectric strips form first and second dielectric lines, and the conductor planes and first and second linear conductor patterns on the circuit board form first and second suspended lines. The first conductor pattern is arranged in a direction intersecting nearly perpendicular to the first dielectric strip, and first and second filter circuits for cutting off a signal which propagates through the first suspended line are provided at at least two places which are on opposite sides of the first dielectric strip of the first dielectric pattern in such a manner as to be coupled to the first dielectric line, thus forming a first resonance circuit. Two diodes are mounted in series with respect to the first conductor pattern within this first resonance circuit. The second conductor pattern is extended from substantially the midpoint between the first and second filter circuits in a direction along the length of the first dielectric strip. A third filter circuit is provided in this second conductor pattern, thus forming a second resonance circuit between the position which connects to the first conductor pattern and the third filter circuit. The second dielectric strip is disposed at a position which connects to this second resonance circuit. This balanced mixer is adapted for propagating an RF signal and an Lo signal through the first and second dielectric lines, respectively.

With the above-described construction, since a circuit board is disposed between two substantially parallel conductor planes, the ease of mounting of the circuit board into the dielectric line increases. Further, since a first conductor pattern is arranged in a direction intersecting nearly perpendicular to the first dielectric strip, filter circuits are provided at at least two places which are on opposite sides of the first dielectric strip of the first conductor pattern, thus forming a first resonance circuit, and since two diodes are mounted within the first resonance circuit, a suspended line which constitutes the first resonance circuit is magnetically connected to the first dielectric line and resonates, causing energy from the first dielectric line to be applied sufficiently to the two diodes. That is, matching between the first dielectric line and the two diodes is achieved, and conversion losses can be suppressed satisfactorily.

Further, since a second conductor pattern is extended in a direction along the length of the first dielectric strip from substantially the midpoint between two filter circuits, a third filter circuit is provided in the second conductor pattern. Thus, a second resonance circuit is formed at the position which connects to the first conductor pattern, i.e., between substantially the midpoint between the first and second filter circuits and the third filter circuit, and since a second dielectric strip is disposed at a position which connects to the second resonance circuit, a suspended line based on the second resonance circuit and the second dielectric line are magnetically connected to each other and resonate, and mode conversion between the suspended line and the second dielectric line is performed with low loss. Therefore, by causing an RF signal (received signal) and an Lo signal (local signal) to be propagated through the first and second dielectric lines, respectively, the RF signal and the Lo signal are supplied to the two diodes, respectively, and an IF signal (intermediate frequency signal) is generated.

According to a second aspect of the balanced-type mixer of the present invention, the electrical length from substantially the midpoint between the first and second filter circuits to the first and second filter circuits are each made an integral multiple of substantially ½ wavelength of the frequency of a signal which propagates through the first dielectric line. Further, the electrical length from substantially the midpoint between the first and second filter circuits to the third filter circuit is made an integral multiple of substantially ½ wavelength at the frequency of a signal which propagates through the second dielectric line. As a result, the first resonance circuit resonates with a signal which propagates through the first dielectric line, and the second resonance circuit resonates with a signal which propagates through the second dielectric line, making it possible to perform mode conversion between the suspended line and the dielectric line at the highest possible efficiency, respectively.

According to a third aspect of the invention, that portion of the first dielectric line which connects to at least the first suspended line may be formed so as to transmit the single LSM01 mode by properly determining the spacing between the conductor planes in the cut-off region and the propagation region, and the thickness of the circuit board and the dielectric constants of each section of the cut-off region and the propagation region so, that the cut-off frequency of the LSM01 mode is lower than the cut-off frequency of the LSE01 mode in the propagation region, and the electromagnetic waves of the LSM01 mode and the LSE01 mode are cut off in the cut-off region. Further, according to a fourth aspect of the invention, a mode suppressor for suppressing the LSE01 mode may be provided in that portion of the first dielectric line which connects to at least the first suspended line so that the single LSM01 mode is transmitted. In either of these cases, the first dielectric line and the second suspended line are not connected to each other in the LSE01 mode, thereby achieving isolation between the RF signal and the Lo signal.

The above and further objects, aspects and novel features of the invention will become more apparent from the following detailed description when read in connection with the accompanying drawings.

DESCRIPTION OF EMBODIMENTS OF THE INVENTION

The construction of a balanced-type mixer according to a first embodiment of the present invention will be described below with reference to FIGS. 1A, 1B to 5.

Figure 1A:
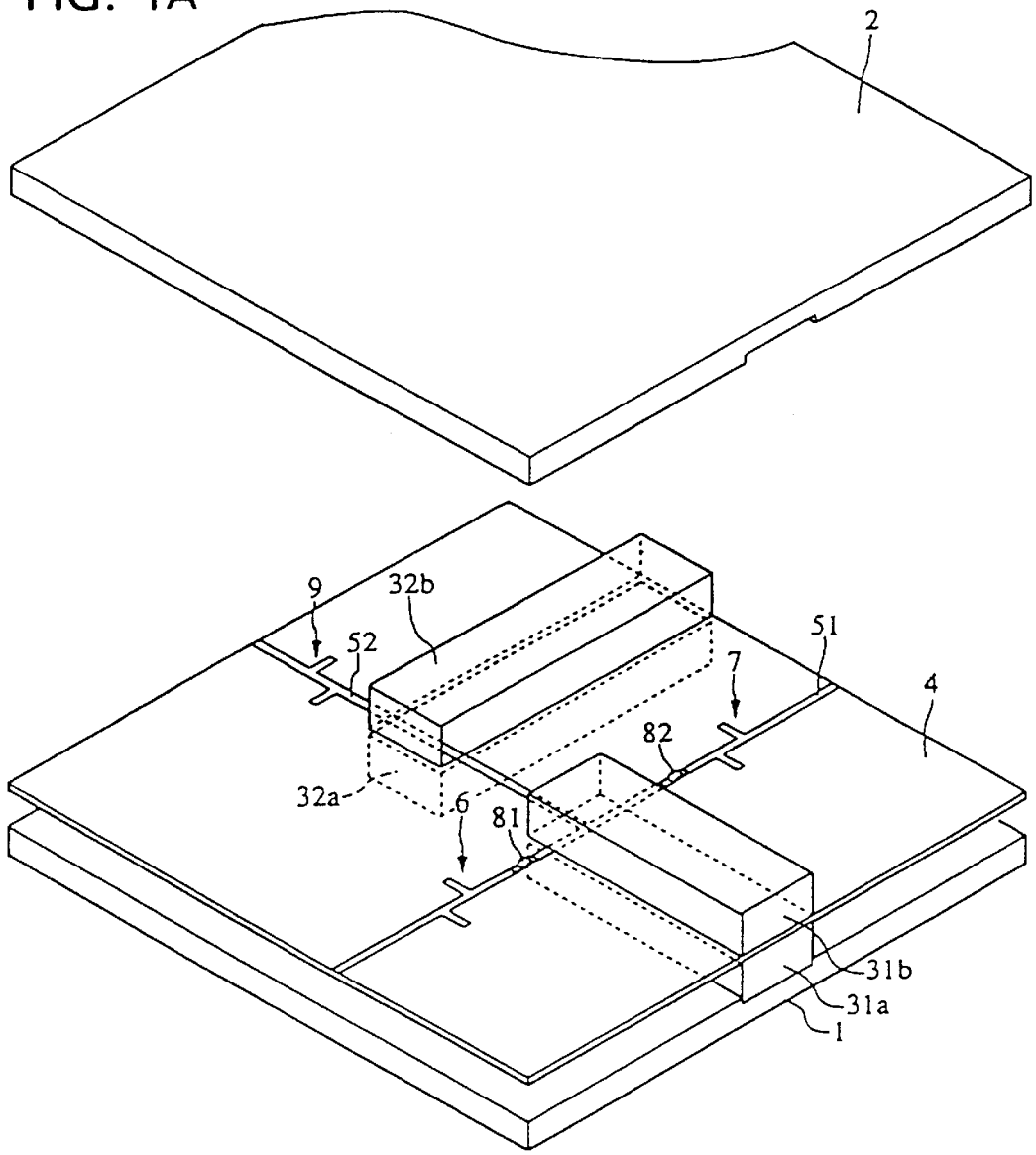
FIGS. 1A and 1B are respectively an exploded perspective view and a front view illustrating the construction of a balanced-type mixer according to a first embodiment of the present invention.
Figure 1B:
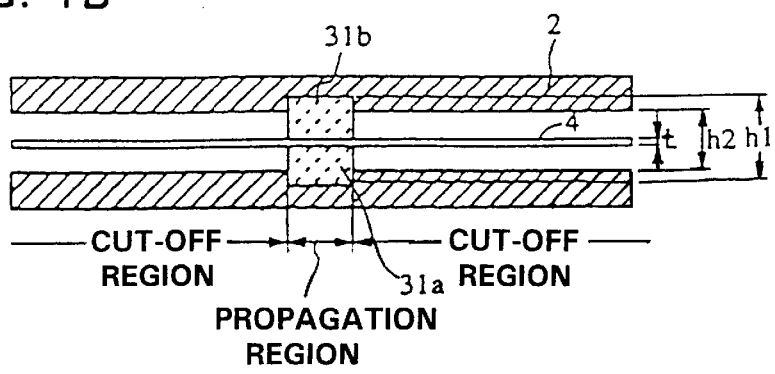

FIGS. 1A and 1B show the construction of the balanced-type mixer; FIG. 1A is a perspective view thereof with an upper conductor plate thereof is lifted; and FIG. 1B is a sectional view thereof. In FIG. 1A, reference numerals 1 and 2 denote conductor plates which form two parallel conductor planes, with dielectric strips 31a, 31b, 32a and 32b disposed together such that the circuit board 4 is disposed between these two conductor plates 1 and 2. The inner surface of each of the conductor plates 1 and 2 is formed with a groove, and the first dielectric strips 31a and 31b and the second dielectric strips 32a and 32b are fitted into the grooves, respectively. Further, the circuit board 4 is supported at a peripheral support section thereof outside of the figure and is disposed parallel to the conductor plates 1 and 2 at the central position of the upper and lower conductor plates 1 and 2. Furthermore, the conductor plates 1 and 2 are linked at their peripheral portions outside of the figure, and form two parallel conductor planes in the dielectric line portion as shown in the figure.

The dielectric strips 31a, 31b, 32a and 32b in FIG. 1A are formed of a dielectric material of a resin or ceramic, with a transverse section being formed into a substantially rectangular shape with respect to the direction of its length. The spacing between the conductor plates 1 and 2 is made less than $\lambda/2$, the wavelength of the millimeter electromagnetic waves to be transmitted being denoted as $\lambda$. The portion where there are no dielectric strips 31a, 31b, 32a or 32b is a cut-off region where the propagation of polarized electromagnetic waves parallel to the conductor plates 1 and 2 is cut off, whereas the portion containing the dielectric strips 31a, 31b, 32a and 32b is a propagation region where the cut-off state is released and electromagnetic waves are propagated along the dielectric strips 31a, 31b, 32a and 32b. Furthermore, in order to make the cut-off frequency of the LSM01 mode lower than the cut-off frequency of the LSE01 mode in the propagation region and to cause the electromagnetic waves of the LSM01 mode and the LSE01 mode to be cut off in the cut-off region, appropriate values are set for the spacing h1 between the conductor plates 1 and 2 in the propagation region and the spacing h2 between the conductor plates 1 and 2 in the cut-off region shown in FIG. 1B, the thickness t of the circuit board 4, and the dielectric constants of the dielectric strips 31a and 31b and the circuit board 4. As a result, the first dielectric strips 31a and 31b and the upper and lower conductor plates 1 and 2 form a first NRD guide which transmits the single mode of the LSM01 mode. In a similar manner, the second dielectric strips 32a and 32b and the upper and lower conductor plates 1 and 2 form a second NRD guide which transmits the single mode of the LSM01 mode. The second NRD guide need not, however, always transmit the single mode of the LSM01 mode, but should be capable of transmitting at least the LSM01 mode.

In FIG. 1A, a first conductor pattern 51 is provided on the top surface of the circuit board 4 in a direction intersecting perpendicular to the length direction of the dielectric strips 31a and 31b, with this first conductor pattern 51 and the upper and lower conductor plates 1 and 2 forming a first suspended line. In the first conductor pattern 51, first and second filter circuits 6 and 7 are formed at positions on opposite sides of the first dielectric strip portion, with the first suspended line between these first and second filter circuits forming a first resonance circuit. Within this first resonance circuit, two beam lead diodes 81 and 82, which are Schottky barrier diodes, are mounted in such a manner as to be connected in series.

A second conductor pattern 52 is extended from the center point between the first and second filter circuits 6 and 7 in the direction of the length of the first dielectric strips 31a and 31b, with this second conductor pattern 52 and the upper and lower conductor plates 1 and 2 forming a second suspended line. A third filter circuit 9 is provided in the second conductor pattern. A suspended line between the position which connects to the first conductor pattern 51 and the third filter circuit 9 is formed into a second resonance circuit, and the second NRD guide formed of the second dielectric strips 32a and 32b and the upper and lower conductor plates 1 and 2 is magnetically connected to this second resonance circuit.

Figure 2:
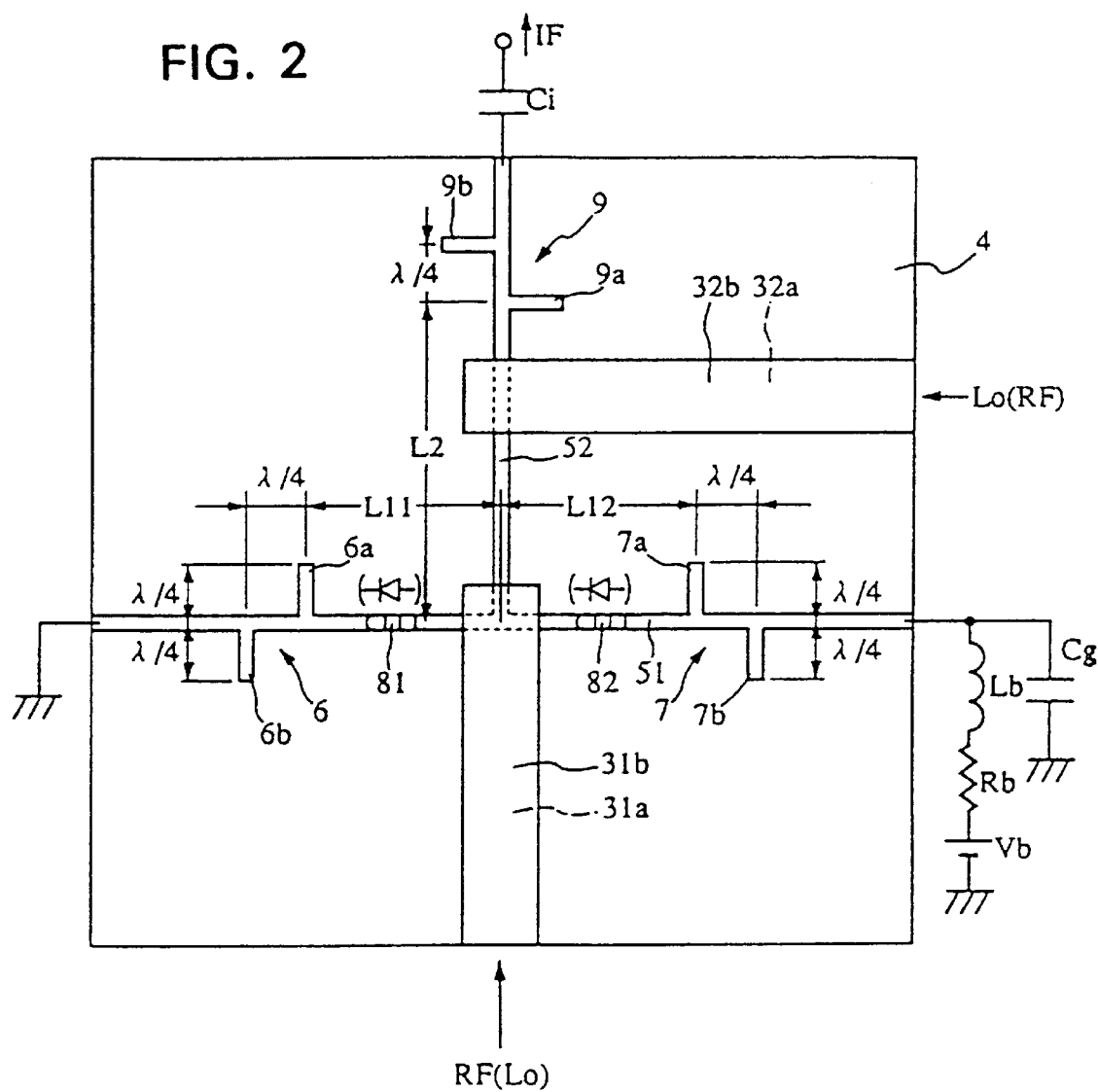
FIG. 2 is a plan view of a balanced-type mixer with its upper conductor plate being removed.
Figure 3:
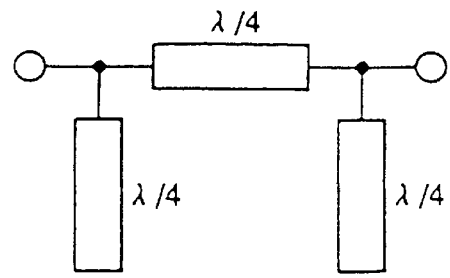
FIG. 3 is an equivalent circuit diagram of a filter circuit.

FIG. 2 is a plan view of the balanced-type mixer with its upper conductor plate being removed. Reference numerals 6a, 6b, 7a, 7b, 9a and 9b each denote an open stub of substantially $\lambda/4$. The spacing between stubs 6a and 6b, the spacing between stubs 7a and 7b, and the spacing between stubs 9a and 9b are each made substantially $\lambda/4$. With the provision of open stubs of $\lambda/4$ spaced apart by $\lambda/4$ as described above, an equivalent circuit is formed as shown in FIG. 3, and this functions as a band elimination filter (BEF) which eliminates a frequency signal of a wavelength $\lambda$.

Further, as a result of making the electrical length of spacings L11 and L12 from the midpoint between the first and second filter circuits 6 and 7 to the first and second filter circuits an integral multiple of substantially ½ wavelength, respectively, at the frequency of the millimeter waves which propagate through the first NRD guide, this portion (the suspended line between the filter circuits 6 and 7) functions as a resonance circuit with both ends being short-circuited. Further, the electrical length of the spacing L2 from the midpoint between the first and second filter circuits 6 and 7 to the open stub 9a is associated with an integral multiple of substantially ½ wavelength at the frequency of the millimeter waves which propagate through the second NRD guide based on the second dielectric strips 32a and 32b. Since the electrical lengths of the above-described spacings L11 and L12 are substantially ½ wavelength, the midpoint between the first and second filter circuits is short-circuited equivalently. Therefore, this portion (the suspended line between the midpoint between the filter circuits 6 and 7 and the filter 9) also functions as a resonance circuit with both ends being short-circuited.

In order to make the electrical lengths of the spacings L11 and L12 an integral multiple of ½ wavelength, a geometrical distance may be determined or it may be determined experimentally by taking into consideration the length of the conductor pattern 51 in the portion where the dielectric strips 31a and 31b are connected to the suspended line, namely, the portion sandwiched from top and bottom by the dielectric strips 31a and 31b, the dielectric constants of the dielectric strips 31a and 31b and the circuit board 4, and the reactance components of the beam lead diodes 81 and 82.

The two beam lead diodes 81 and 82 are mounted in series with respect to the conductor pattern 51 within the first resonance circuit formed of the first conductor pattern 51 and the first and second filter circuits 6 and 7. Therefore, the first NRD guide formed of the first dielectric strips 31a and 31b and the upper and lower conductor plates matches the diodes 81 and 82, and the RF signal or the Lo signal which propagates through the first dielectric strips 31a and 31b is converted into the mode of a suspended line and applied to the beam lead diodes 81 and 82.

On the other hand, the second resonance circuit based on the second conductor pattern 52 is magnetically connected to the second NRD guide formed of the second dielectric strips 32a and 32b and the upper and lower conductor plates. Therefore, upon inputting of the Lo signal or the RF signal from this second NRD guide, the signal is converted into the mode of the suspended line and is applied in opposite phases to the two beam lead diodes 81 and 82.

A bias-voltage supply circuit comprising an inductor Lb, a resistor Rb and a DC source Vb is connected to one end of the first conductor pattern 51, and this end of this first conductor pattern 51 is also grounded for high frequency using a capacitor Cg. The inductor Lb cuts off the leakage of the IF signal to the bias-power supply circuit. With this construction, the RF signal and the Lo signal are applied to the two beam lead diodes 81 and 82 with a phase difference of 180°, and the frequency components of the difference between the RF signal and the Lo signal are at phases opposite to each other. However, since the directions of the two diodes are opposite to each other when viewed from the IF circuit, the frequency components of the above-described difference are synthesized at the same phase and are taken out as an IF signal via a capacitor Ci. The bias voltage applied to the IF circuit is prevented by the capacitor Ci from generating an output current.

Since the first NRD guide based on the dielectric strips 31a and 31b does not transmit the LSE01 mode but transmits the single mode of the LSM01 mode, the second suspended line based on the second conductor pattern 52 and the first NRD guide do not connect to each other in the LSE01 mode. Further, due to the orthogonality of modes, the first NRD guide and the second conductor pattern 52 also do not connect to each other in the LSM01 mode. Therefore, the first and second NRD guides also do not connect to each other via the second conductor pattern 52.

Figure 4:
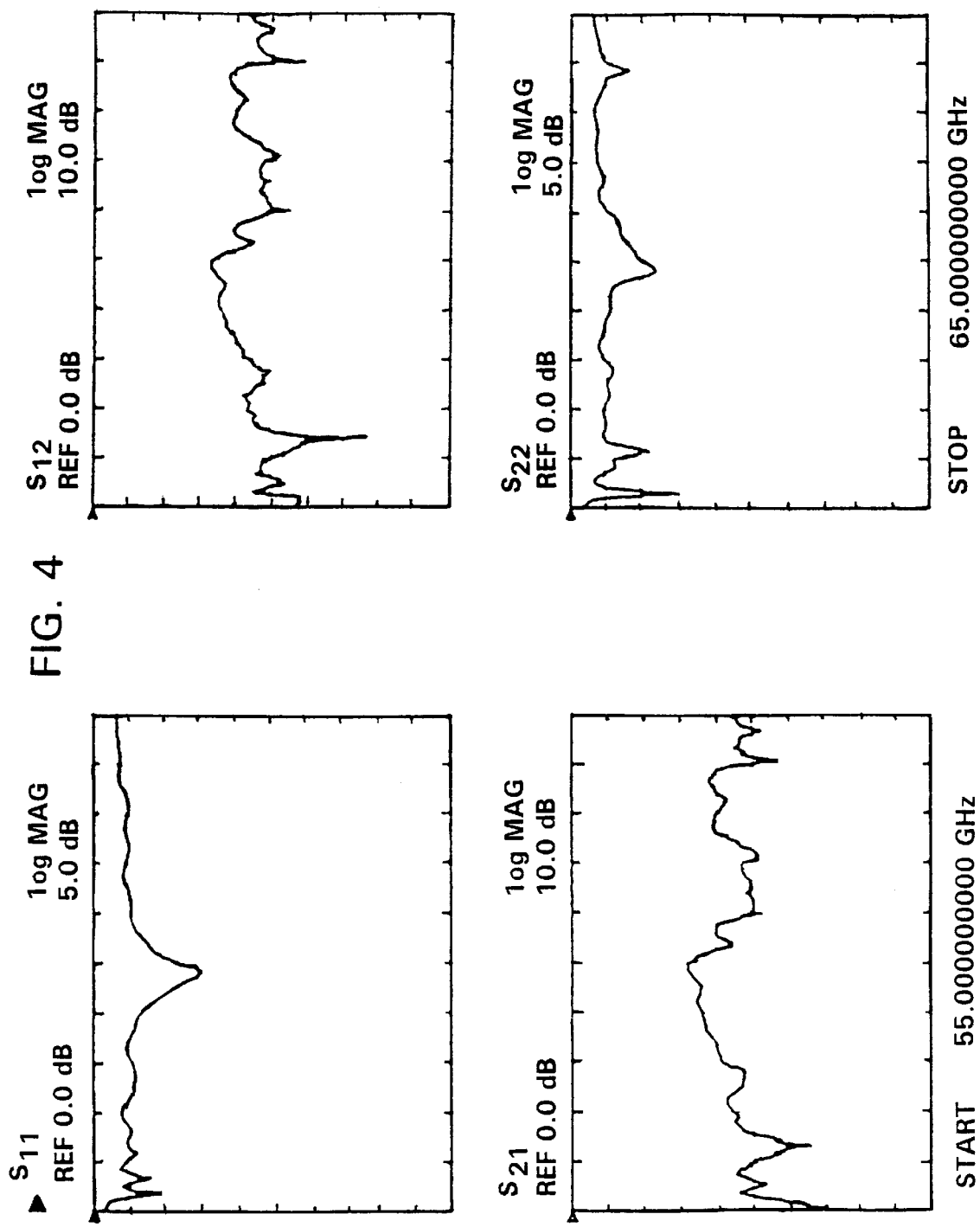
FIG. 4 shows electrical characteristics of the balanced-type mixer according to the first embodiment of the present invention.

FIG. 4 shows measurement results of an S parameter of the balanced-type mixer shown in FIGS. 1A, 1B through 3, with the first NRD guide based on the dielectric strips 31a and 31b functioning as port 1 and the second NRD guide based on the dielectric strips 32a and 32b functioning as port 2. As described above, since the first and second NRD guides do not connect to each other, it is possible to sufficiently secure the isolation between the ports to which the RF signal and the Lo signal are input, respectively, as shown in FIG. 4.

Figure 5:
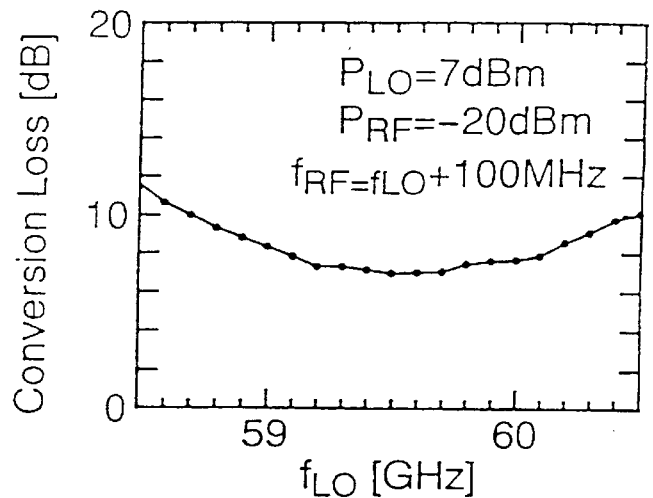
FIG. 5 shows electrical characteristics of the balanced-type mixer according to the first embodiment of the present invention.

FIG. 5 shows the conversion loss of the above-described mixer. Here, the conversion loss is determined with the IF signal being set at 100 MHz. As shown in the figure, the conversion loss becomes less than 7.5 dB at near 59.6 GHz, and thus a mixer having high conversion efficiency can be obtained.

Figure 6A:
FIGS. 6A, 6B, 6C and 6D show the construction of another filter circuit.
Figure 6B:
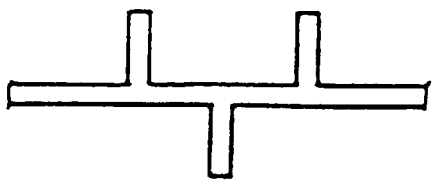
Figure 6C:
Figure 6D:
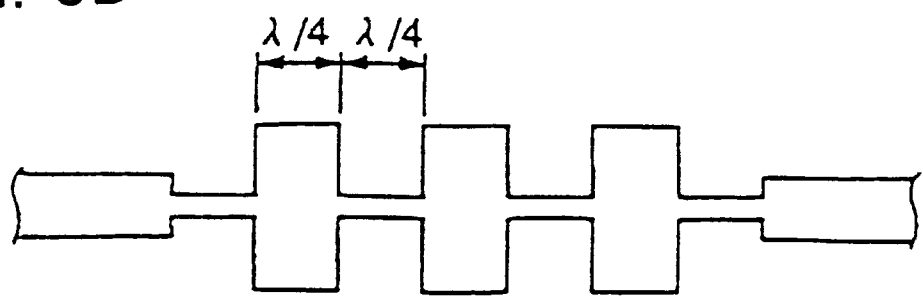

Although the filter circuit shown in FIGS. 1A, 1B to 3 is formed with two open stubs being disposed at predetermined intervals, in addition to this, a single open stub of $\lambda/4$ may be provided as shown in FIG. 6A when the frequency band to be suppressed may be narrow. When, in contrast, a large frequency band is to be suppressed, as shown in FIG. 6B, three or more open stubs may be provided. In this case, the respective lengths of the stubs and the spacings between respective pairs of stubs should be changed little by little according to the frequency band to be suppressed. As shown in FIG. 6C, even when a single open stub is provided, it is possible to have a wide cut-off frequency band by properly selecting the shape of the pattern. Further, as shown in FIG. 6D, a low-pass filter (LPF) which cuts off the resonance frequency of the above-described resonance circuit may be formed by providing the conductor pattern with a transmission line capacitor and inductor.

Figure 7A:
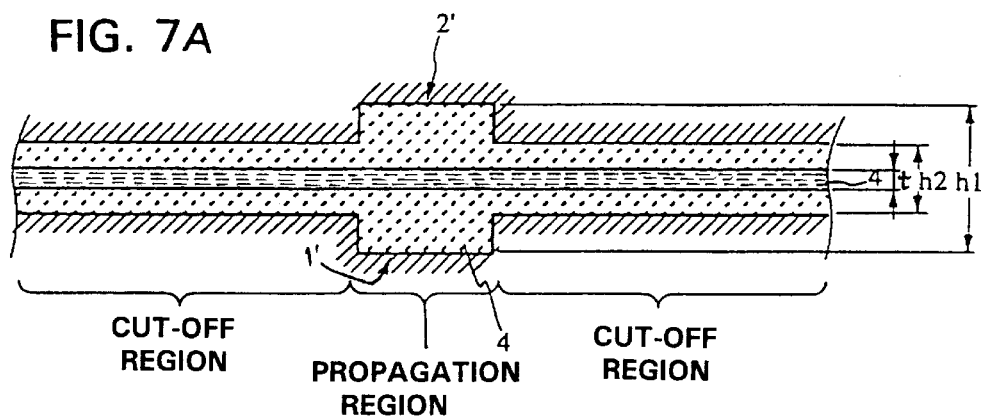
FIGS. 7A and 7B show the construction of another dielectric line.
Figure 7B:
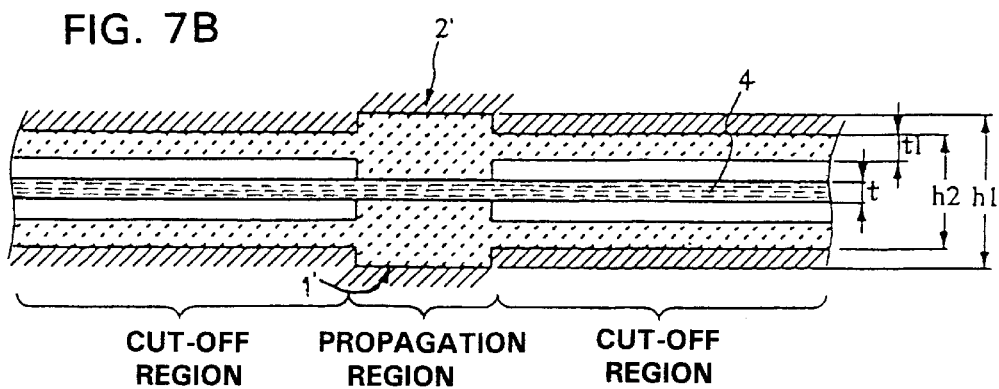

Further, although in the example shown in FIGS. 1A and 1B a groove is formed in the conductor plate and a dielectric strip is fitted into the groove, in addition to this, as shown in FIGS. 7A and 7B, it may be possible to use a dielectric strip having a wing (brim) portion, to form conductor planes 1' and 2' with a plating film on the external surface of the wing, and to sandwich the circuit board 4 between the dielectric strips. Then, each dimension h1, h2, t, and t1, which are shown in FIGS. 7A and 7B, and the dielectric constants of the dielectric strip and the circuit board, are determined, and the single-mode transmission of the LSM01 mode may be performed.

Figure 8A:
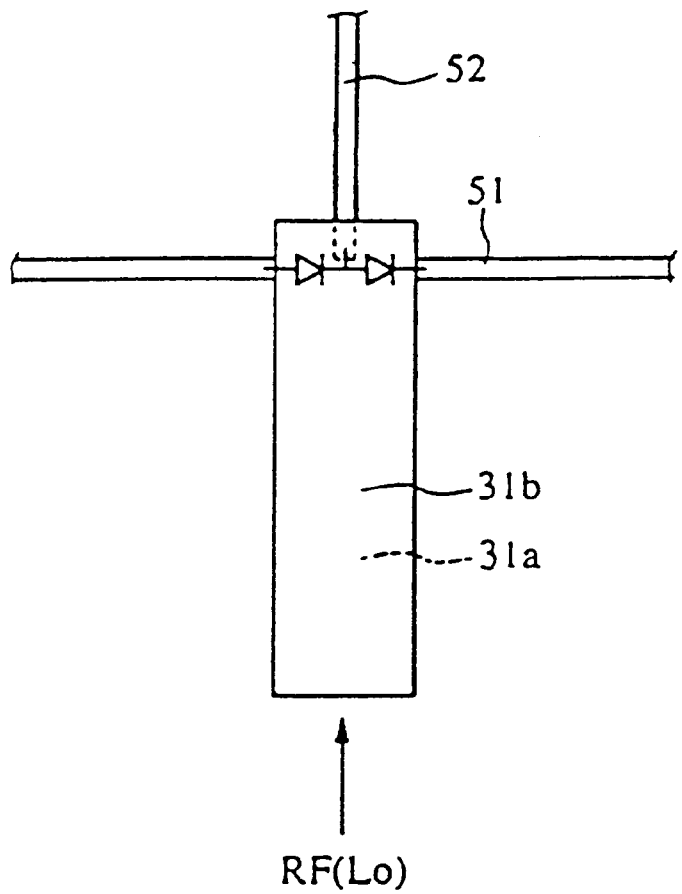
FIGS. 8A and 8B show another diode mount structure.
Figure 8B:
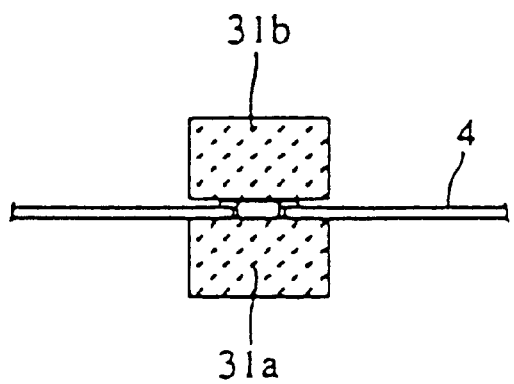

Although the example shown in FIGS. 1A, 1B and 2 describes a case in which two beam lead diodes are mounted individually, for example, as shown in FIGS. 8A and 8B, a structure in which that two diodes are integrated may be mounted. FIG. 8A is a top plan view of an integrated-diode mounted portion. FIG. 8B is a sectional view thereof. When this integrated diode is mounted at a position sandwiched by the dielectric strips 31a and 31b, as shown in FIG. 8B, a recess portion or a hole for avoiding the thickness of the diode may be provided in the circuit board 4. The integrated diode is fitted into the recess portion or hole, and the leads of the integrated diode are connected to the first conductor pattern 51 on the circuit board.

Figure 9:
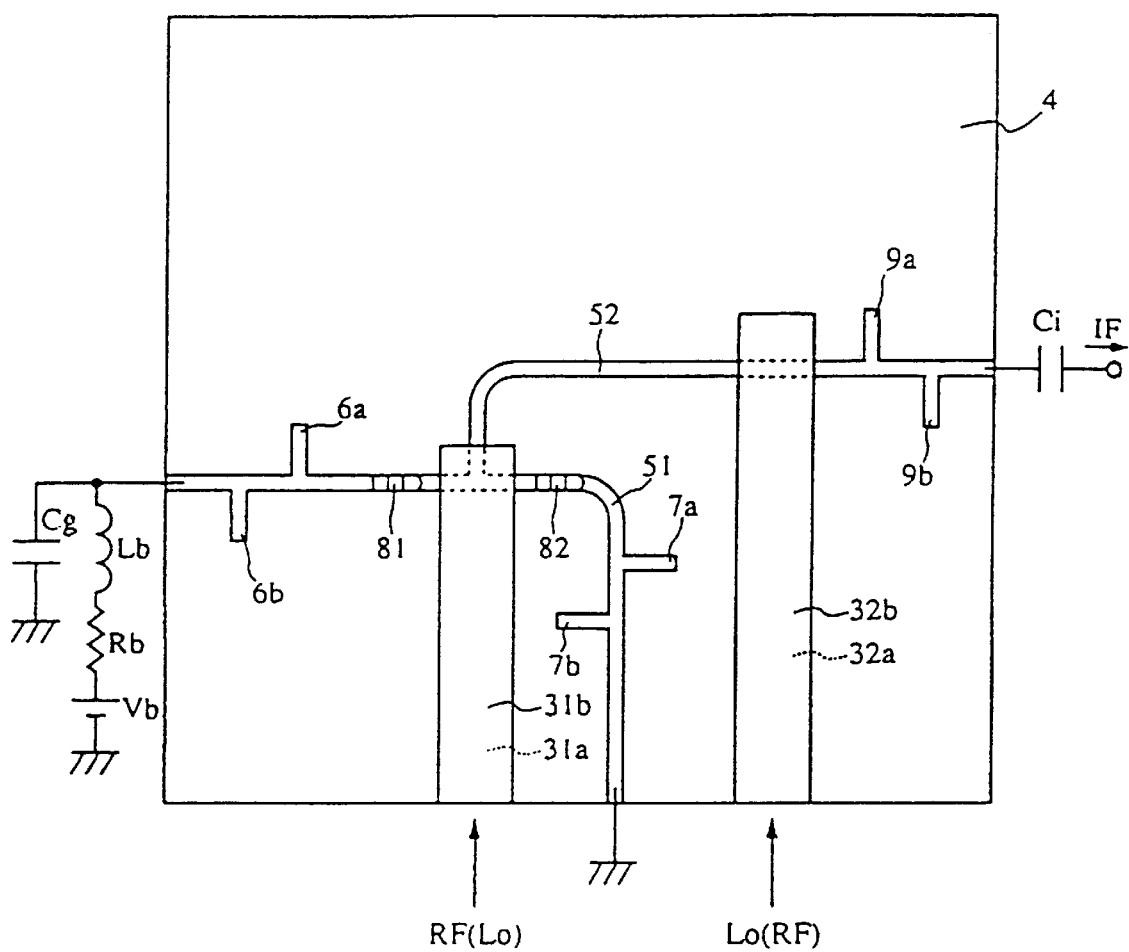
FIG. 9 shows the construction of a balanced-type mixer according to a second embodiment of the present invention.

Next, the construction of a balanced-type mixer according to a second embodiment of the present invention is shown in FIG. 9. Although in the first embodiment first and second dielectric strips are disposed on straight lines intersecting at right angles to each other, in this second embodiment, as shown in FIG. 9, by providing the conductor patterns with curves, the first and second dielectric strips are disposed parallel to each other. The operation of each section in FIG. 9 is the same as the operation of each section shown by the same reference numerals in FIG. 2. With such a construction it becomes easy to form a balanced-type mixer in a dielectric line apparatus in which dielectric strips through which an RF signal and a Lo signal propagate are disposed parallel to each other.

Among other advantages, this construction can simplify packaging the mixer and connecting the mixer to external circuits.

Figure 10:
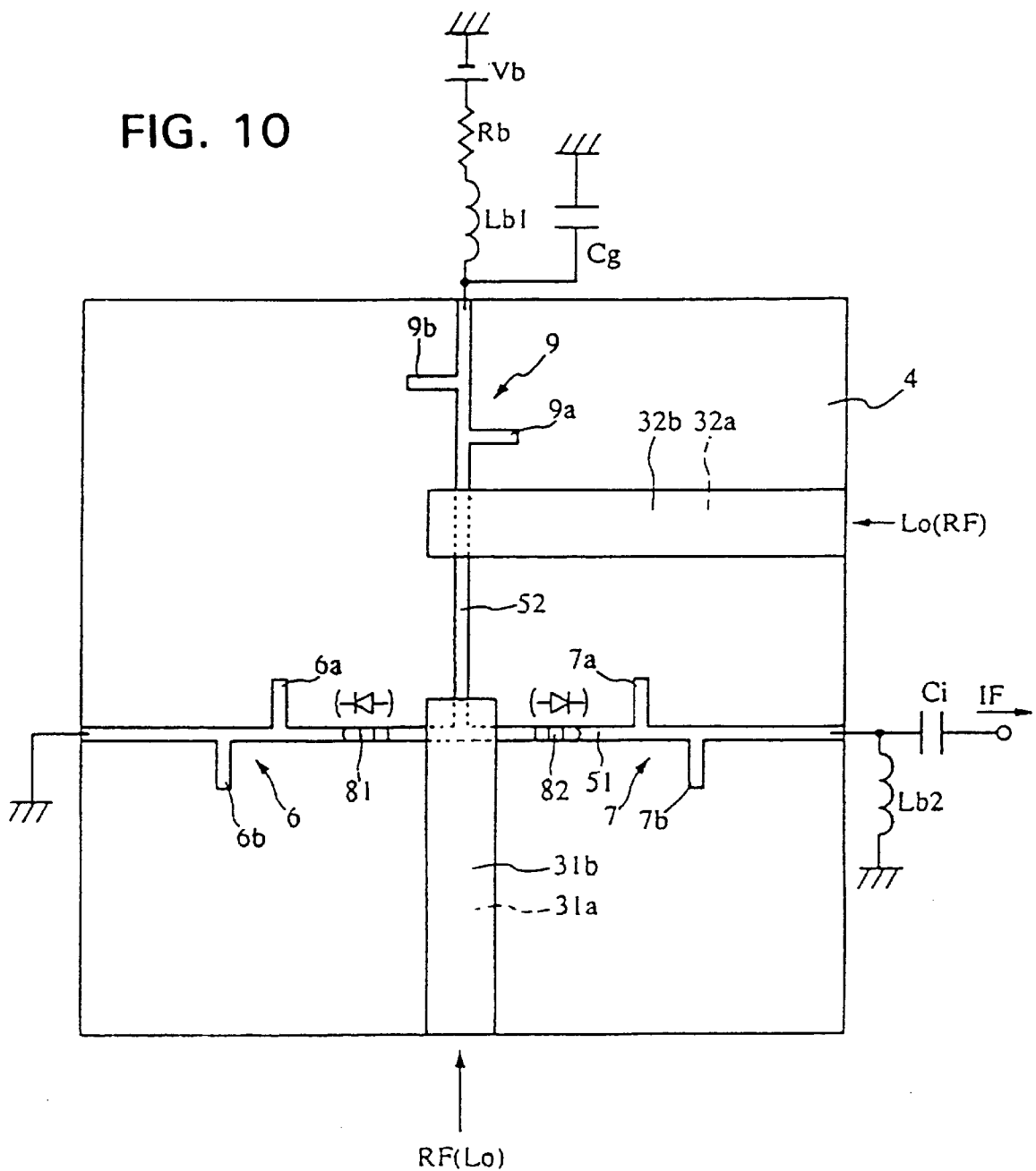
FIG. 10 shows the construction of a balanced-type mixer according to a third embodiment of the present invention.

Next, the construction of a balanced-type mixer according to a third embodiment of the present invention is shown in FIG. 10. The difference of this embodiment from the first embodiment shown in FIG. 2 is the connection relationship of a bias-voltage supply circuit and the direction of the two beam lead diodes 81 and 82. That is, although in the first embodiment an IF signal is taken out from the end portion of the second conductor pattern 52, in this third embodiment, a bias-voltage supply circuit a DC supply Vb, a resistor Rb, and an inductor Lb1 is connected to the end portion of the second conductor pattern 52, a high frequency IF signal is grounded via a capacitor Cg, one end of the first conductor pattern 51 is grounded, an inductor Lb2 is connected between the other end of the pattern 51 and ground, and the IF signal is taken out from this other end via a capacitor Ci. Whereas in the construction shown in FIG. 2 two diodes are connected in series when viewed from the IF circuit, according to the above-described construction, the two diodes are connected in parallel when viewed from the IF circuit and therefore, the impedance viewed from the IF circuit is decreased. The more appropriate of the two constructions may be selected according to the construction of the IF circuit.

Figure 11A:
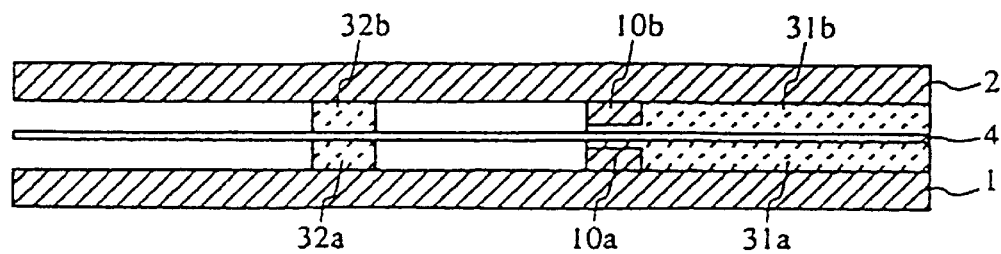
FIGS. 11A and 11B show the construction of a balanced-type mixer according to a fourth embodiment of the present invention.
Figure 11B:
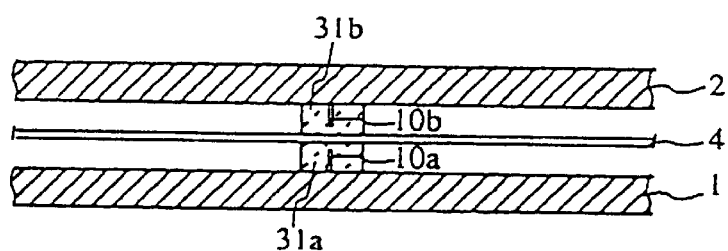
Figure 12:
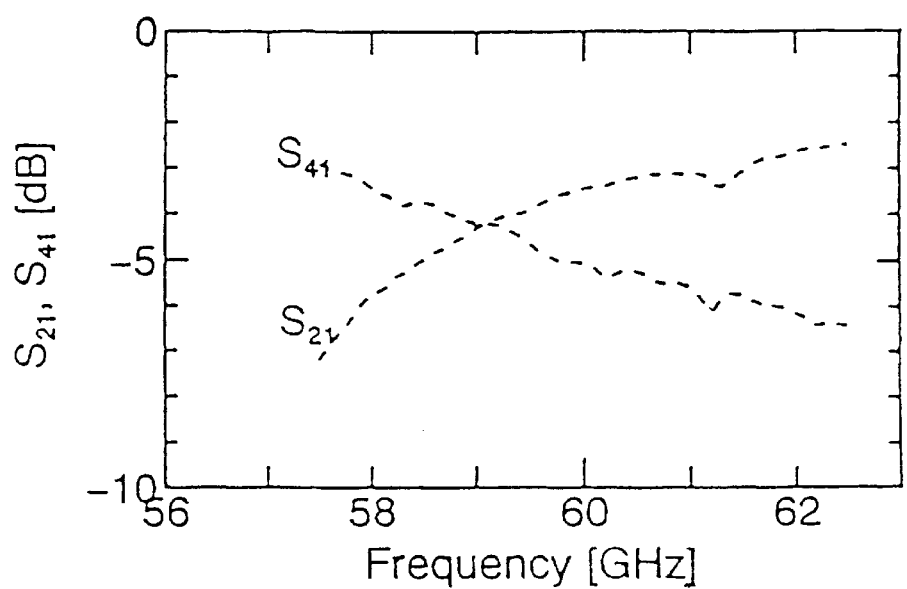
FIG. 12 shows electrical characteristics of a coupler based on a conventional dielectric line.

Next, the construction of a balanced-type mixer according to a fourth embodiment of the present invention is shown in the sectional views of FIGS. 11A and 11B. In the example shown in FIGS. 1A and 1B in the first embodiment an NRD guide which transmits the single mode of the LSM01 mode is formed by determining the spacing between conductor planes in the cut-off region and the propagation region, the thickness of the circuit board and the dielectric constants of each section of the cut-off region and the propagation region. However, in the plane construction of FIGS. 2, 9 and 10 the multiplex-mode transmission becomes problematical in the case of the connection between the first NRD guide based on the first dielectric strips 31a and 31b and the second suspended line based on the second conductor pattern 52 in the LSE01 mode. Therefore, the LSE01 mode should be suppressed at least in the connection portion where the first NRD guide based on the dielectric strips 31a and 31b is connected to the first suspended line based on the first conductor pattern 51. The plane construction of the balance-type mixer shown in FIGS. 11A and 11B is similar to that shown in FIG. 2 or 10. FIG. 11A is a sectional view in a direction along the second conductor pattern 52. FIG. 11B is a sectional view in a direction along the first conductor pattern 51. As shown in these figures, mode suppressors 10a and 10b formed of conductors in contact with the conductor plates 1 and 2 are provided near the end portions (the portion where the first conductor pattern intersects) of the dielectric strips 31a and 31b. With this construction, the LSE01 mode is suppressed in the end portion (the portion connected to the first suspended line based on the first conductor pattern 51) of the first NRD guide based on the dielectric strips 31a and 31b. The second suspended line based on the second conductor pattern 52 and the first NRD guide do not connect to each other in the LSE01 mode, thereby maintaining the isolation between the first and second NRD guides.

Many different embodiments and equivalent arrangements of the present invention may be constructed without departing from the spirit and scope of the present invention. It should be understood that the present invention is not limited to the specific embodiments described in this specification. The scope of the following claims is to be accorded the broadest interpretation so as to encompass all such modifications, equivalent structures and functions.

What is claimed is:

1. A balanced-type mixer comprising:

a circuit board with first and second conductor patterns thereon, said circuit board being sandwiched between two pairs of dielectric strips, each pair of dielectric strips comprising a first and a second dielectric strip and being disposed between two substantially parallel conductor planes, said conductor planes and said first and second pairs of dielectric strips forming first and second dielectric lines, respectively, and said conductor planes forming first and second suspended lines with said first and second conductor patterns on said circuit board, wherein the first conductor pattern is arranged in a direction intersecting with the first dielectric strip, and first and second filter circuits for cutting off a signal which propagates through the first suspended line are provided at at least two places in the first conductor pattern which are on opposite sides of the first dielectric strip in such a manner as to be coupled to the first dielectric line, thus forming a first resonance circuit, two diodes are mounted in series with respect to the first conductor pattern within the first resonance circuit, and the second conductor pattern is extended from said first conductor pattern at substantially the midpoint between the first and second filter circuits in a direction along the length of the first dielectric strip, and a third filter circuit is provided in this second conductor pattern, whereby the second conductor patter forms a second resonance circuit between the first conductor pattern and the third filter circuit, the second dielectric line being disposed at a position which intersects with this second resonance circuit, whereby said balanced-type mixer is adapted for propagating an RF signal and a Lo signal through the first and second dielectric lines, respectively.

2. A balanced-type mixer according to claim 1, wherein the electrical lengths from substantially the midpoint between the first and second filter circuits to the first and second filter circuits are each an integral multiple of substantially ½ wavelength at the frequency of a signal which propagates through the first dielectric line, and the electrical length from substantially the midpoint between the first and second filter circuits to the third filter circuit is an integral multiple of substantially ¼ wavelength at the frequency of a signal which propagates through the second dielectric line.

3. A balanced-type mixer according to claim 2, wherein a portion of the first dielectric line which connects to at least first suspended line has a predetermined spacing between the conductor planes of a cut-off region and a propagation region, a predetermined thickness of the circuit board, and predetermined dielectric constants of each section of the cut-off region and the propagation region, such that the cut-off frequency of the LSM01 mode is lower than the cut-off frequency of the LSE01 mode in the propagation region and the electromagnetic waves of the LSM01 mode and the LSE01 mode are cut off in the cut-off region, so as to transmit substantially only the LSM01 mode.

4. A balanced-type mixer according to claim 3, wherein said second dielectric line is capable of transmitting at least the LSM01 mode.

5. A balanced-type mixer according to claim 4, wherein said second dielectric line is capable of transmitting substantially only the LSM01 mode.

6. A balanced-type mixer according to claim 2, further comprising a mode suppressor for suppressing the LSE01 mode disposed in a portion of the first dielectric line which connects to at least the first suspended line so that substantially only the LSM01 mode is transmitted.

7. A balanced-type mixer according to claim 1, wherein a portion of the first dielectric line which connects to at least first suspended line has a predetermined spacing between the conductor planes of a cut-off region and a propagation region, a predetermined thickness of the circuit board, and predetermined dielectric constants of each section of the cut-off region and the propagation region, such that the cut-off frequency of the LSM01 mode is lower than the cut-off frequency of the LSE01 mode in the propagation region and the electromagnetic waves of the LSM01 mode and the LSE01 mode are cut off in the cut-off region, so as to transmit substantially only the LSM01 mode.

8. A balanced-type mixer according to claim 7, wherein said second dielectric line is capable of transmitting at least the LSM01 mode.

9. A balanced-type mixer according to claim 8, wherein said second dielectric line is capable of transmitting substantially only the LSM01 mode.

10. A balanced-type mixer according to claim 1, further comprising a mode suppressor for suppressing the LSE01 mode disposed in a portion of the first dielectric line which connects to at least the first suspended line so that substantially only the LSM01 mode is transmitted.

11. A balanced-type mixer according to claim 1, wherein said first and second dielectric lines extend substantially perpendicular to said first and second conductor patterns, respectively.

* * * * *